United States Patent
Pancholi et al.

(10) Patent No.: US 8,856,712 B2
(45) Date of Patent: Oct. 7, 2014

(54) OPTIMIZED FLIP-FLOP DEVICE WITH STANDARD AND HIGH THRESHOLD VOLTAGE MOS DEVICES

(71) Applicant: SanDisk Technologies Inc., Plano, TX (US)

(72) Inventors: Deepak Pancholi, Bangalore (IN); Srikanth Bojja, Bangalore (IN); Bhavin Odedara, Bangalore (IN)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/659,253

(22) Filed: Oct. 24, 2012

(65) Prior Publication Data
US 2014/0043078 A1    Feb. 13, 2014

(30) Foreign Application Priority Data
Aug. 13, 2012    (IN) .......................... 3354/CHE/2012

(51) Int. Cl.
| G06F 17/50 | (2006.01) |
| H03K 19/00 | (2006.01) |
| H01L 25/00 | (2006.01) |
| H03K 19/003 | (2006.01) |
| H03K 19/177 | (2006.01) |
| H03K 19/0175 | (2006.01) |

(52) U.S. Cl.
CPC ........ *G06F 17/5072* (2013.01); *G06F 17/5081* (2013.01); *H03K 19/003* (2013.01); *H03K 19/177* (2013.01); *H03K 19/0175* (2013.01); *H01L 25/00* (2013.01)
USPC ........... 716/119; 716/122; 716/133; 716/127; 716/129; 716/130; 326/31; 326/36; 326/41; 326/47; 326/80; 326/101

(58) Field of Classification Search
CPC ............ G06F 17/5072; G06F 17/5081; H03K 19/003; H03K 19/177; H03K 19/0175; H01L 25/00
USPC ................. 716/119, 122, 133, 127, 129, 130; 326/31, 36, 41, 47, 63, 80, 101
See application file for complete search history.

(56) References Cited

U.S. PATENT DOCUMENTS

| 5,629,638 | A | * | 5/1997 | Kumar .......................... 326/121 |
| 5,656,956 | A | * | 8/1997 | Ohta et al. ..................... 326/120 |

(Continued)

OTHER PUBLICATIONS

Chen et al., "Mixed Multi-threshold differential Cascode Voltage Switch (MT-DCVS) Circuit Styles and Strategies for Low Power VLSI Design", 2001 International Sumposium on Low Power Electronics and Design, Aug. 6-7, 2001, pp. 263-266.*

*Primary Examiner* — Phallaka Kik
(74) *Attorney, Agent, or Firm* — Brinks Gilson & Lione

(57) ABSTRACT

A flip-flop operating with standard threshold voltage MOS devices as compared with high threshold voltage MOS devices may have improved speed performance, but greater leakage current. Likewise, a flip-flop operating with high threshold voltage MOS devices may reduce the leakage current and have better power efficiency, but decreased speed and performance. An optimized flip-flop may include a combination of standard threshold voltage MOS devices and high threshold voltage MOS devices. The optimized flip-flop may have less leakage during stand-by mode as compared to a flip-flop with standard threshold voltage MOS devices. In addition, the optimized flip-flop may have better performance and speed as compared to a flip-flop with high threshold voltage MOS devices.

6 Claims, 7 Drawing Sheets

(56) References Cited

U.S. PATENT DOCUMENTS

| | | | |
|---|---|---|---|
| 6,492,854 B1 * | 12/2002 | Ku et al. | 327/202 |
| 7,281,230 B2 * | 10/2007 | Chung et al. | 716/114 |
| 7,285,986 B2 * | 10/2007 | Lovett et al. | 326/95 |
| 7,416,927 B2 * | 8/2008 | Gottsche et al. | 438/154 |
| 7,545,999 B2 * | 6/2009 | Kuekes et al. | 385/14 |
| 7,772,917 B2 * | 8/2010 | Itoh et al. | 327/534 |
| 7,795,917 B2 * | 9/2010 | Barasinski et al. | 326/83 |
| 7,977,972 B2 * | 7/2011 | Di et al. | 326/46 |
| 8,207,758 B2 * | 6/2012 | Di et al. | 326/120 |
| 8,399,935 B2 * | 3/2013 | Liaw | 257/393 |
| 8,429,586 B2 * | 4/2013 | Venkatraman et al. | 716/122 |
| 2003/0016075 A1 * | 1/2003 | Itoh | 327/534 |
| 2003/0042965 A1 * | 3/2003 | Kanno et al. | 327/333 |
| 2003/0155962 A1 * | 8/2003 | Itoh et al. | 327/534 |
| 2004/0155281 A1 * | 8/2004 | Osada et al. | 257/315 |
| 2004/0217802 A1 * | 11/2004 | Itoh et al. | 327/534 |
| 2005/0106789 A1 * | 5/2005 | Gottsche et al. | 438/163 |
| 2005/0254326 A1 * | 11/2005 | Kitahara | 365/218 |
| 2007/0024322 A1 * | 2/2007 | Ye et al. | 326/98 |
| 2007/0040585 A1 * | 2/2007 | Lovett et al. | 326/98 |
| 2007/0096231 A1 * | 5/2007 | Kuekes et al. | 257/431 |
| 2007/0109034 A1 * | 5/2007 | Itoh et al. | 327/534 |
| 2007/0246767 A1 * | 10/2007 | Osada et al. | 257/314 |
| 2008/0211025 A1 * | 9/2008 | Gottsche et al. | 257/351 |
| 2008/0218211 A1 * | 9/2008 | Barasinski et al. | 326/62 |
| 2009/0179693 A1 * | 7/2009 | Itoh et al. | 327/537 |
| 2011/0032000 A1 * | 2/2011 | Di et al. | 326/98 |
| 2011/0102019 A1 * | 5/2011 | Osada et al. | 326/102 |
| 2012/0133390 A1 * | 5/2012 | Di et al. | 326/36 |
| 2012/0175683 A1 * | 7/2012 | Venkatraman et al. | 257/202 |
| 2012/0293198 A1 * | 11/2012 | Di et al. | 326/21 |
| 2013/0181740 A1 * | 7/2013 | Smith et al. | 326/46 |
| 2014/0028348 A1 * | 1/2014 | Andreev et al. | 326/41 |

* cited by examiner

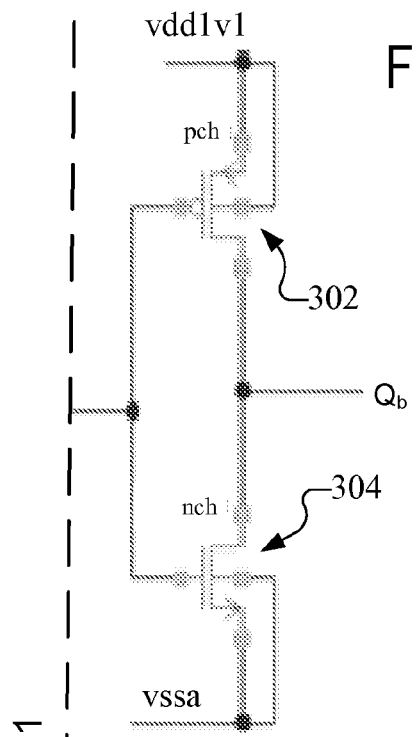
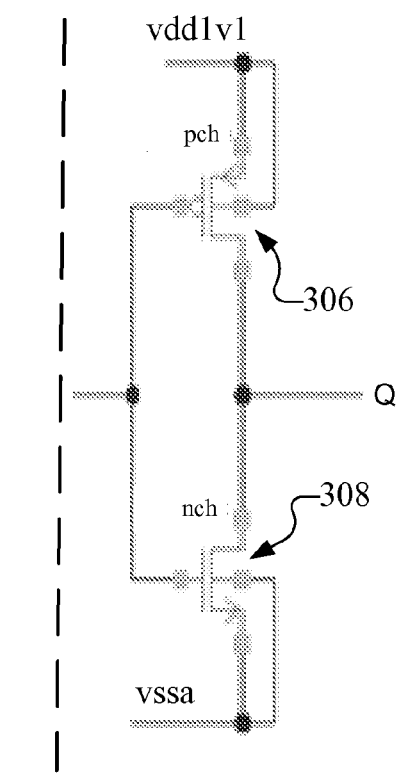
Figure 3

US 8,856,712 B2

OPTIMIZED FLIP-FLOP DEVICE WITH STANDARD AND HIGH THRESHOLD VOLTAGE MOS DEVICES

PRIORITY CLAIM

This application claims priority to Indian Patent Application No. 3354/CHE/2012, filed on Aug. 13, 2012, the entire disclosure of which is hereby incorporated by reference.

TECHNICAL FIELD

This application relates generally to an optimized flip-flop. More specifically, this application relates to improving performance and reducing leakage by utilizing a combination of standard and high threshold voltage (Vt) devices.

BACKGROUND

A flip-flop is a basic circuit used to store state information. Flip-flops may be elements in sequential machines, such as a finite state machine, counter, register file, storage buffer, etc. Conventional flip-flop designs may focus on performance or area optimization, especially with respect to flip-flops used in microprocessors. However, power efficiency of every circuit is becoming increasingly important. Various flip-flop designs may sacrifice power for performance or vice-versa. One power usage consideration is the amount of leakage current in standby mode of applications. Accordingly, leakage current should be minimized for efficient power usage while not severely limiting performance.

SUMMARY

A flip-flop operating with standard threshold voltage metal oxide semiconductor ("MOS") devices as compared with high threshold voltage MOS devices may have improved performance and greater speed, but greater leakage current (i.e. increased standby power). Likewise, a flip-flop operating with high threshold voltage MOS devices may have reduced leakage current and have better power efficiency, but decreased speed performance. An optimized flip-flop may include a combination of standard threshold voltage MOS devices and high threshold voltage MOS devices. The optimized flip-flop may consume less leakage power during stand-by mode as compared to a flip-flop with standard threshold voltage MOS devices. In addition, the optimized flip-flop may have better performance or speed as compared to a flip-flop with high threshold voltage MOS devices.

BRIEF DESCRIPTION OF THE DRAWINGS

FIG. 3 is a part of the exemplary flip flop circuit of FIG. 1.

BRIEF DESCRIPTION OF THE PRESENTLY PREFERRED EMBODIMENTS

Figure 1:
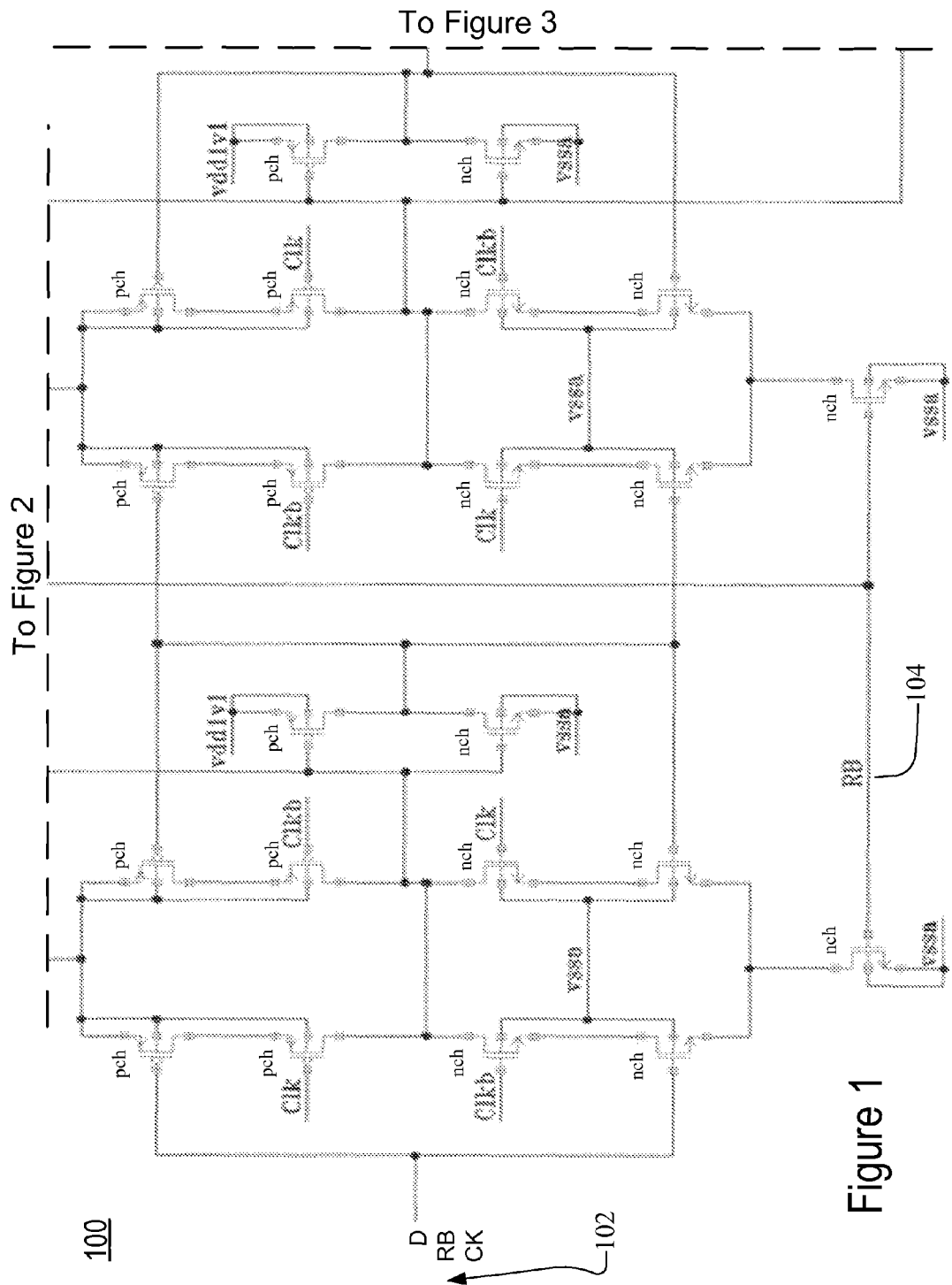
FIG. 1 is an exemplary flip flop circuit.

High threshold voltage ("HVT") MOS devices as compared with standard threshold voltage ("SVT") devices may have reduced current leakage, but decreased speed performance. Likewise, SVT devices may be faster with decreased delay, but may suffer from increased current leakage. A circuit may be optimized by identifying which circuit elements should be HVT devices and which should be SVT devices. The circuit elements that contribute to the main path of the circuit may be SVT devices to maximize the speed. The circuit elements that are not part of the main path or may not otherwise be active frequently may include HVT devices to reduce current leakage without limiting speed. For example, the transistors that relate to an infrequent signal (e.g. a reset signal) may be replaced with HVT devices.

A flip-flop operating with standard threshold voltage metal oxide semiconductor ("MOS") devices as compared with high threshold voltage MOS devices may have improved performance, but greater leakage current. Likewise, a flip-flop operating with high threshold voltage MOS devices may have reduced leakage current and have better power efficiency, but decreased speed performance. An optimized flip-flop may include a combination of standard threshold voltage MOS devices and high threshold voltage MOS devices. The optimized flip-flop may consume less leakage power during stand-by mode as compared to a flip-flop with standard threshold voltage MOS devices. In addition, the optimized flip-flop may have better performance or speed as compared to a flip-flop with high threshold voltage MOS devices.

Metal oxide semiconductor ("MOS") may refer to the physical structure of certain field effect transistors, having a metal gate electrode placed on top of an oxide insulator, which in turn is on top of a semiconductor material. Complementary metal oxide semiconductor ("CMOS") is a technology for constructing integrated circuits. CMOS may be used in a variety of digital logic circuits and may also be used in microprocessors, microcontrollers, static RAM, and memory devices, such as flash drives. CMOS technology may be used for analog circuitry, including image sensors, data converters, and/or transceivers for different types of communication. CMOS circuits may utilize p-type and n-type metal oxide semiconductor field-effect transistors ("MOSFETs") to implement logic gates and other digital circuits found in computing and signal processing equipment. Typical commercial CMOS products may be integrated circuits composed of millions of transistors of both types on silicon. These devices may be referred to as chips, die, or dies. CMOS circuits are used to implement logic gates with p-type and n-type MOSFETs to create paths to the output from either the voltage source or ground. When a path to the output is created from the voltage source, the circuit is said to be pulled up. The other circuit state occurs when a path to output is created from ground and the output pulled down to the ground potential.

As described, the devices or transistors used for the optimized flip-flop may include N-type metal oxide-semiconductor ("NMOS") or p-type metal oxide-semiconductor ("PMOS"). NMOS logic utilizes n-type metal oxide-semiconductor field effect transistors ("MOSFETs") to implement logic gates and other digital circuits. PMOS logic utilizes p-type MOSFETs to implement logic gates and other digital circuits.

As the device size continues to shrink, there are lower geometries in the CMOS process, which results in the drain leakage current of the standard MOS devices in the CMOS process becoming higher. The drain leakage current may result in significant power losses in the latest system on a chip ("SoC") designs. In traditional CMOS processes (e.g. higher than 180 nanometer devices) there is usually only one type of threshold voltage ("Vt") based core device or transistor. For the smaller devices (e.g. 40 nm or below), there may be different types of cells or devices. For example, there may be low Vt ("LVT"), standard Vt ("SVT"), and/or high Vt ("HVT") devices.

The HVT devices may be used if the design path is not timing constrained or timing critical. If the timing constraints is not met, then the HVT device may be switched with a SVT or LVT device. SVT and LVT devices are faster in comparison to HVT devices but also have higher leakage currents during stand-by mode. Accordingly, design paths in the circuit that are timing critical may remain SVT or LVT devices to maintain performance. The timing critical path may also be referred to as a critical path. Timing critical circuits may be blocks like standard cells which need to complete a desired operation in a given short duration as required by events occurring at their input and output stages. Utilizing multiple types of devices (HVT, SVT, LVT) may allow for an optimized circuit with improved speed and reduced leakage. This optimization is described below with respect to a flip-flop, but may be applicable to other circuits.

FIG. 1 is an exemplary flip flop circuit 100. The circuit 100 may represent a conventional flip flop design, such as a D type flip flop. The optimization of devices may also be applicable to other flip flop designs and other circuits. In one embodiment, when the flip flop includes all NMOS and PMOS devices with a standard threshold voltage ("SVT"), there may be higher leakage. Likewise, if all the devices are HVT, there may be reduced leakage, but reduced speed performance. LVT may have even higher speed performance as compared to SVT devices but also higher leakage. Accordingly, the optimization of the circuit 100 in FIG. 1 includes identifying certain devices to exchange. For the example shown in FIGS. 1-4, the circuit 100 may have all SVT devices and some of them will be replaced with HVT devices to reduce leakage but avoid hampering speed performance below a minimum threshold.

The optimization of a circuit includes identifying which devices should be SVT to limit leakage that will not severely reduce speed. Certain devices that include a critical circuit path should not be HVT because delays increase and speed decreases. Timing critical circuits may be blocks like standard cells which need to complete a desired operation in a given duration as required by events occurring at their input and output stages. For those devices in the critical circuit path, SVT or LVT devices should be used for speed performance purposes and the leakage current may be tolerated for those devices to maintain a higher speed.

The flip flop circuit 100 includes a data ("D") input, along with a clock ("CK") input, and a reset ("RB") input. The CK input is further discussed with respect to FIG. 4. The outputs of the flip flop circuit 100 are Q and $Q_b$ as shown in FIG. 3. The reset RB signal 104 is further shown and described with respect to FIG. 2. The two supplies are vdd1v1 and vssa. Vdd1v1 may be a 1.1 voltage supply, but this supply voltage may be different or lower depending upon CMOS process technology.

Figure 2:
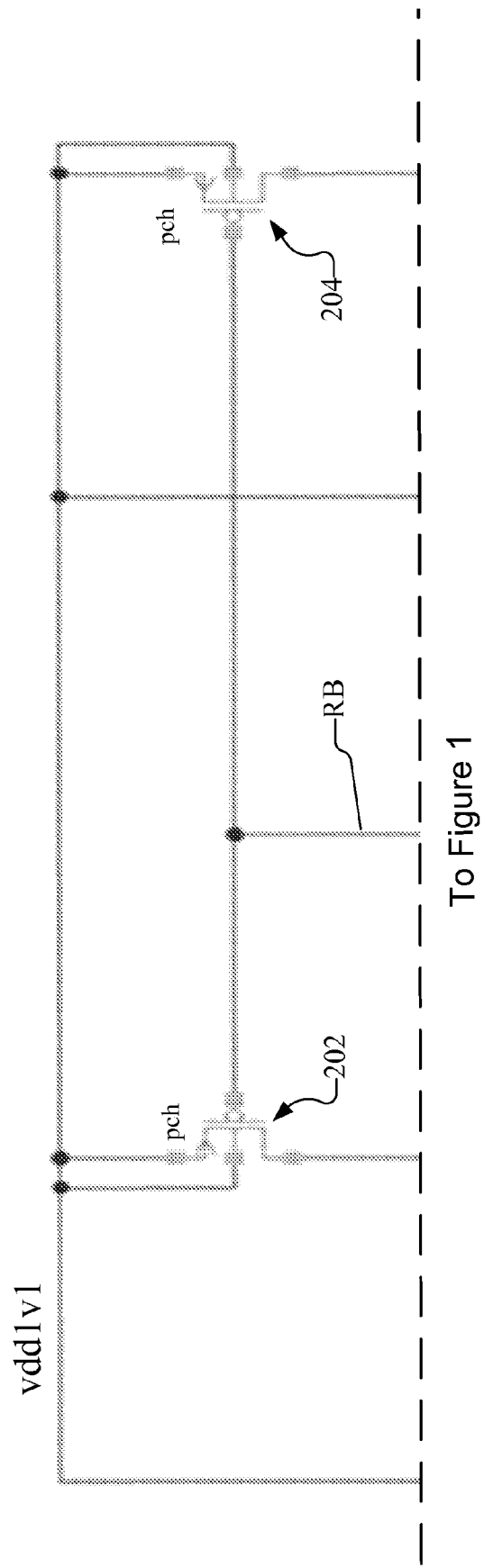
FIG. 2 is a part of the exemplary flip flop circuit of FIG. 1.

The transistors and devices shown in FIG. 1 may all be considered as part of the critical path and are all set as SVT or LVT devices. In other words, no devices in FIG. 1 are HVT devices. FIG. 1 is connected with FIG. 2. FIG. 2 is a part of the exemplary flip flop circuit of FIG. 1. FIG. 2 illustrates two devices 202, 204 that are optimized as HVT devices. The RB reset signal is provided from FIG. 1 and is used for the two PMOS devices 202, 204 and two NMOS devices whose gate are connected to RB signal, 104 in FIG. 1. Since RB is a reset signal, it may not be a critical path for the circuit. Utilizing HVT devices for the two PMOS devices 202, 204 may reduce leakage without limiting speed. The speed is not reduced significantly because the RB signal provided to the two devices 202, 204 is not a critical or common path that contributes to delay, so the circuit can afford to reduce the leakage with those devices. Since the two PMOS devices 202, 204 control the current; they are good candidates for HVT to reduce leakage. The PMOS device 202 includes a drain of the transistor that goes to the gate of an inverter, which is based on an SVT (or LVT) device. The drain is going to the inverter and to the drain of the PMOS and NMOS devices whose gates are connected to Clock B ("Clkb") and Clock ("Clk"). The main contribution of the clock to Q (output) delay (i.e. speed delays) comes from the inverters, which remain as SVT (or LVT) devices.

Referring back to FIG. 1, the outputs of the flip flop circuit 100 are not shown in FIG. 1, but are part of FIG. 3. FIG. 3 is a part of the exemplary flip flop circuit of FIG. 1. The devices 302, 304, 306, 308 are other examples of devices that can be converted to HVT devices. Converting the devices 302, 304, 306, 308 to HVT devices reduces leakage without a significant decrease in speed. In particular, the devices 302, 304, 306, 308 may contribute to delay, but since they have lower leakage, they remain as HVT devices to reduce leakage without significant delays. If the speed performance or CLK to Q delay become even more critical, they may be converted to SVT or LVT devices.

Figure 4:
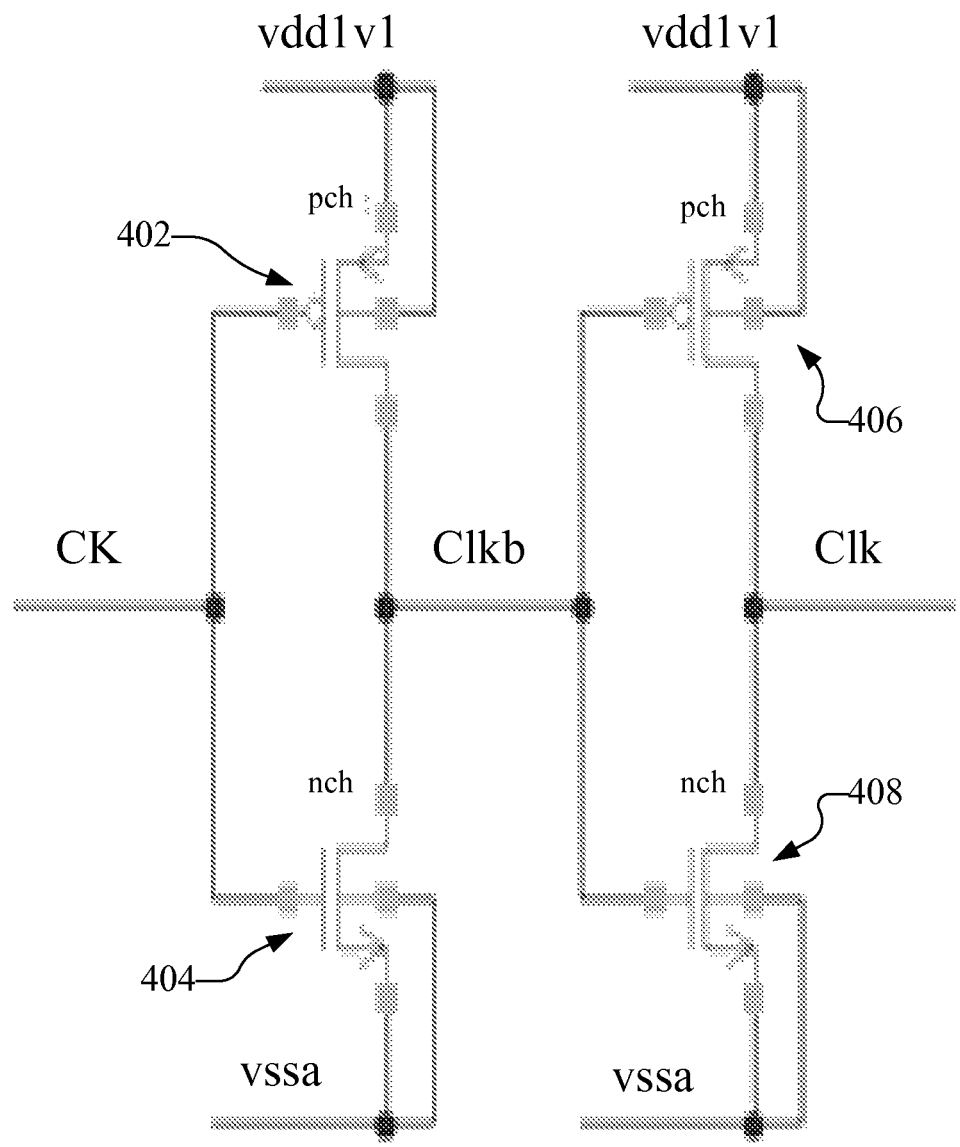
FIG. 4 is a part of another exemplary flip flop circuit.

FIG. 4 is a part of the exemplary flip flop circuit of FIG. 1 illustrating the clock signals. Clk is a buffered signal of CK, while Clkb is a buffered and inverted signal of CK. The devices 402, 404, 406, 408 are additional examples of devices that can be converted to HVT devices. In particular, the devices 402, 404, 406, 408 may contribute to delay, but since they have significantly higher leakage, they remain as HVT devices to reduce leakage without significant delays. Converting the devices 402, 404, 406, 408 to HVT devices reduces leakage without a significant decrease in speed.

Considering the flip flop circuit that includes each of FIGS. 1-4 there are several devices (202, 204, 302, 304, 306, 308, 402, 404, 406, 408, as well as the two NMOS devices connected to RB signal 104 in FIG. 1) that are converted to HVT. The circuit that combines both HVT and SVT devices may have optimized leakage current and improved speed (i.e. reduced delay) as shown below in Tables 1 and 2.

Table 1 illustrates a typical case design comparison between HVT, SVT, and combination SVT+HVT flip flop devices. In other words, the High VT (HVT) includes HVT-only devices, the Std. VT (SVT) includes SVT-only devices, while the SVT+HVT includes a combination of SVT and HVT devices as shown in FIGS. 1-4.

TABLE 1

Comparison of HVT and SVT NMOS/PMOS based flip-flop design with proposed design in typical implementation with typical PVT corner.

|  | Setup (pS) | Clk-Q Delay (pS) | Total Time (pS) | Leakage Current (nA) |
| --- | --- | --- | --- | --- |
| High VT | 73 | 105 | 178 | 50 |
| Std. VT | 40 | 56 | 96 | 420 |
| SVT + HVT | 34 | 72 | 106 | 110 |

As shown, the optimized SVT+HVT circuit reduces leakage current to 110 nano Amps ("nA") as compared with 420 nA for the SVT-only circuit. The HVT-only circuit has even less leakage at 50 nA, but the total time is 178 pico seconds ("pS") as compared with 96 pS for the SVT-only circuit. The optimized SVT+HVT circuit improves the total time as compared with the HVT-only circuit to 106 pS as compared with 178 pS. Although the optimized SVT+HVT circuit total time is larger than the SVT-only total time of 96 pS, the optimized SVT+HVT circuit has significantly improved leakage current without severely reducing speed.

Table 2 illustrates a worst case design (for total delay and leakage current) comparison between HVT, SVT, and combination SVT+HVT flip flop devices.

TABLE 2

Comparison of HVT and SVT NMOS/PMOS based flip-flop design with proposed design in worst case implementation.

| | Setup (pS) | Clk-Q Delay (pS) | Total Time (pS) | Leakage Current (nA) | Effective speed per Unit Leakage Current (GHz/uA) |
|---|---|---|---|---|---|
| High VT | 190 | 260 | 450 | 160 | 13.89 |
| Std. VT | 70 | 100 | 170 | 950 | 6.19 |
| SVT + HVT | 66 | 147 | 213 | 260 | 18.06 |

As shown in Table 2, the optimized SVT+HVT circuit has less leakage current than SVT-only devices (260 nA vs. 950 nA). Although the leakage current of the optimized SVT+HVT circuit is still more than HVT-only devices, the performance (reduced delay) is better for the optimized SVT+HVT circuit compared with HVT-only devices. HVT devices have a higher set-up time (190 pS) and clock to Q (output) delay (260 pS) than the optimized SVT+HVT circuit. While the SVT-only circuit has a low setup time (70 pS) and lower clock to Q delay of 100 pS, the high leakage current of 950 nA is corrected by the optimized SVT+HVT circuit without significantly increasing delay and total time. The optimized SVT+HVT circuit has a total time of 213 pS compared with 170 pS for SVT-only and 450 pS for HVT-only. In other words, even in this worst case implementation, the optimized SVT+HVT circuit significantly reduces leakage current while maintaining only a minimal increase in total delay time.

The "Effective Speed per Unit Leakage Current" parameter may be utilized for selecting whether a particular device should be HVT or SVT as discussed below with respect to FIG. 5. In particular, the "Effective Speed per Unit Leakage Current" may provide information on device replacement and on the relationship of speed to stand-by current such that an optimal combination may be shown in last column of the Table 2. The optimized SVT+HVT flip-flop or circuit has the highest value of "Effective Speed per Unit Leakage Current." The "Effective Speed per Unit Leakage Current" is calculated by dividing the frequency (inverse of total time) by the leakage current. The units of measurement may be modified, but Table 2 illustrates gigahertz over unit micro amperage GHz/uA.

Figure 5:
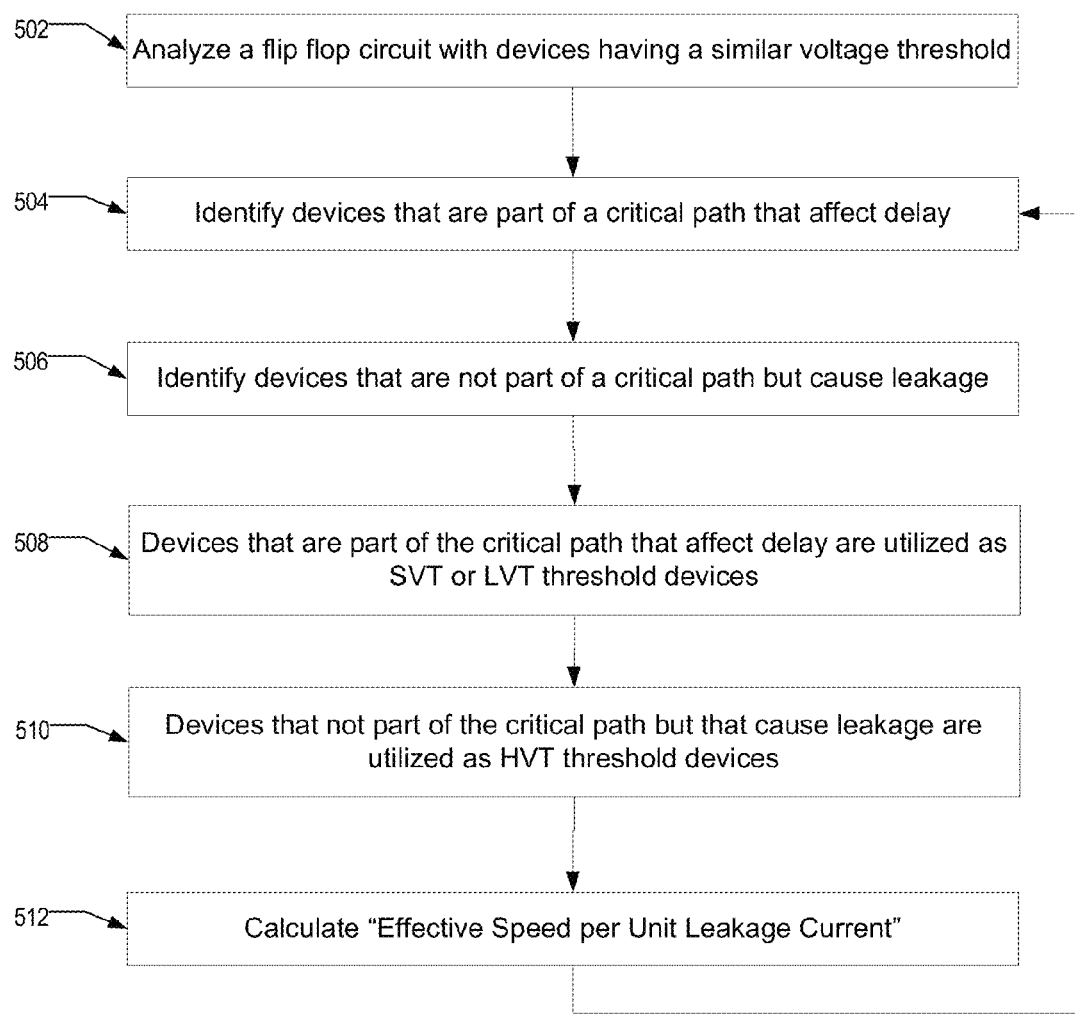
FIG. 5 is a flow chart for optimizing a flip flop circuit.

FIG. 5 is a flow chart for optimizing a flip flop circuit. In block 502, a flip flop circuit with the same voltage level devices is analyzed. The same voltage levels may be for LVT, SVT, or HVT. In alternative embodiments, the analyzed circuit may be a different circuit than a flip flop circuit. In block 504, devices that are part of a critical path that affect delay are identified. In block 506, devices that are not part of a critical path that affect delay, but do affect leakage are identified. In block 508, the devices that are part of the critical path that affect delay are converted or maintained (for an all SVT or LVT circuit) as SVT or LVT devices. In block 510, the devices that not part of the critical path but that cause leakage are converted or maintained (for an all HVT circuit) as HVT devices. In block 512, the "Effective Speed per Unit Leakage Current" parameter is calculated. This parameter may be used for the selection of the optimized devices.

In one embodiment, each of the devices in a circuit may be tested with either HVT or SVT/LVT with a determination being made as to the best combination of speed and minimized leakage using the "Effective Speed per Unit Leakage Current" parameter. In particular, the process may be iterated, such that the "Effective Speed per Unit Leakage Current" is updated with each iteration, and the combination of devices with the highest value may be chosen. In other words, a circuit may be analyzed through multiple iterations where certain devices are changed from HVT to SVT/LVT or vice versa. By iterating the process of testing the circuit using different voltage levels, the "Effective Speed per Unit Leakage Current" may provide an indication of which devices should be HVT and which should be SVT/LVT. After a certain number of iterations, the combination with highest value of this parameter is chosen.

Figure 6:
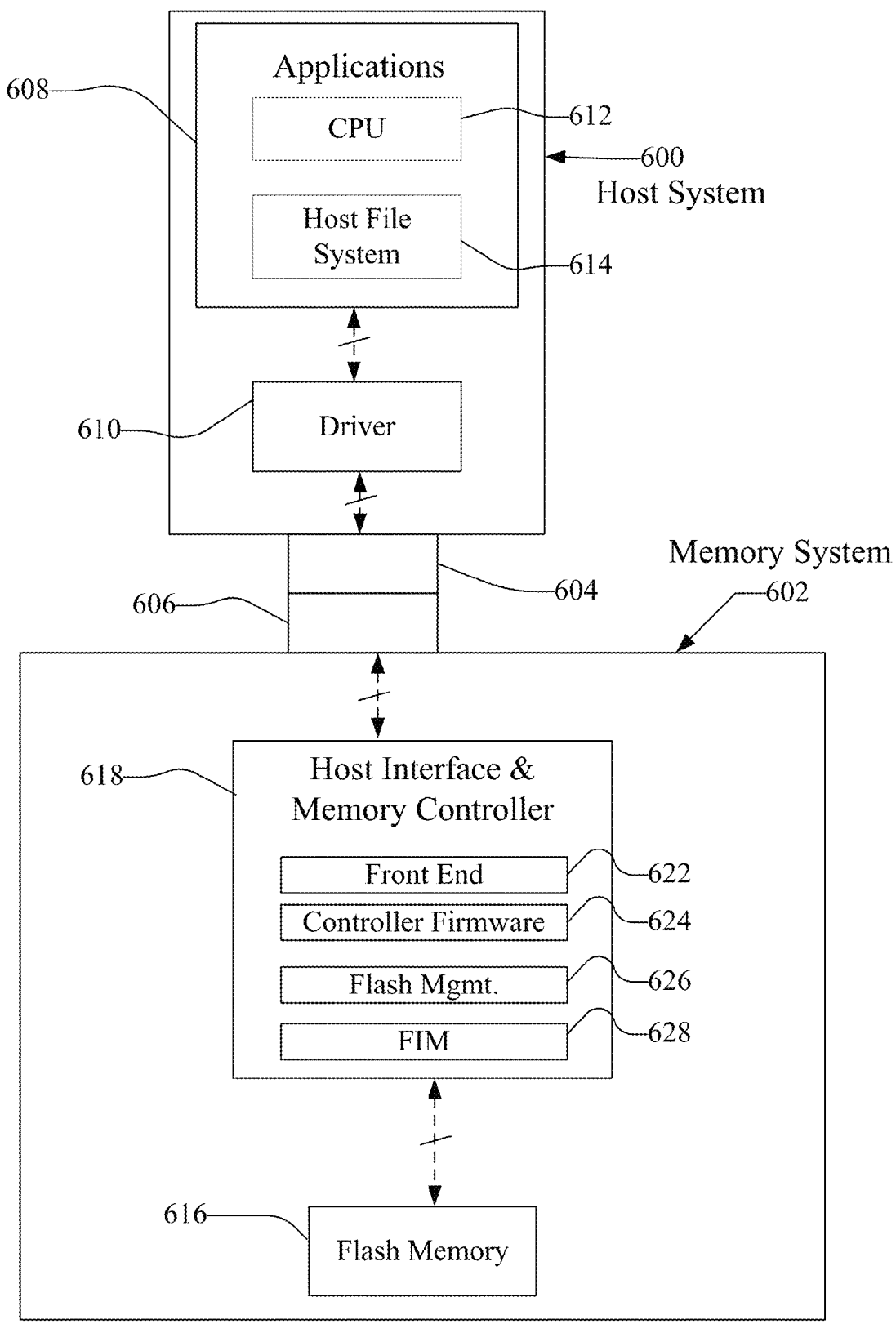
FIG. 6 is a block diagram of a host connected with a memory system having non-volatile memory.
Figure 7:
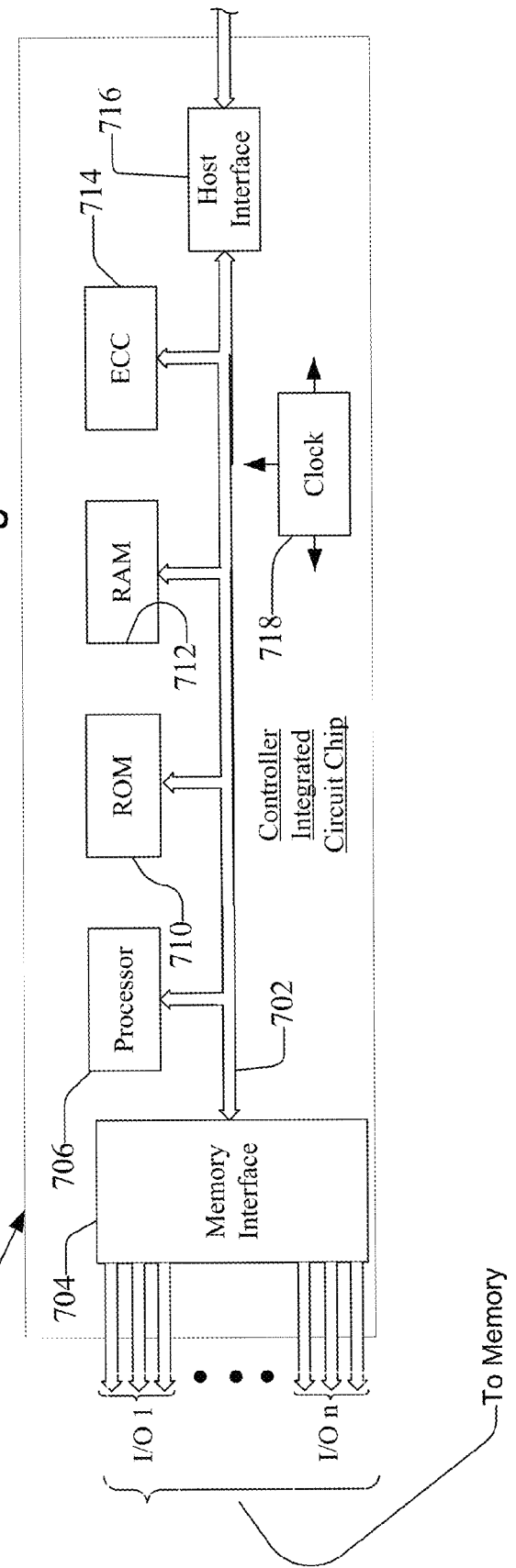
FIG. 7 is a block diagram of an exemplary flash memory system controller for use in the system of FIG. 6.

In one embodiment, the circuit optimization described herein may be applied to flash memory systems. For example, the optimized flip flop in FIGS. 1-4 may be utilized in a flash memory card. A flash memory system which may utilize the circuit optimization and optimized flip flop is shown in FIGS. 6-7. Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

A host system 600 of FIG. 6 stores data into and retrieves data from a flash memory 602. The flash memory may be embedded within the host, such as in the form of a solid state disk (SSD) drive installed in a personal computer. Alternatively, the memory 602 may be in the form of a flash memory card that is removably connected to the host through mating parts 604 and 606 of a mechanical and electrical connector as illustrated in FIG. 6. A flash memory configured for use as an internal or embedded SSD drive may look similar to the schematic of FIG. 6, with one difference being the location of the memory system 602 internal to the host. SSD drives may be in the form of discrete modules that are drop-in replacements for rotating magnetic disk drives.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip.

The host system 600 of FIG. 6 may be viewed as having two major parts, insofar as the memory 602 is concerned, made up of a combination of circuitry and software. They are an applications portion 608 and a driver portion 610 that interfaces with the memory 602. There may be a central processing unit (CPU) 612 implemented in circuitry and a host file system 614 implemented in hardware. In a PC, for example, the applications portion 608 may include a processor 612 running word processing, graphics, control or other popular application software. In a camera, cellular telephone or other host system 614 that is primarily dedicated to performing a single set of functions, the applications portion 608 includes the software that operates the camera to take and store pictures, the cellular telephone to make and receive calls, and the like.

The memory system 602 of FIG. 6 may include non-volatile memory, such as flash memory 616, and a system controller 618 that both interfaces with the host 600 to which the memory system 602 is connected for passing data back and forth and controls the memory 616. The system controller 618 may convert between logical addresses of data used by the host 600 and physical addresses of the flash memory 616 during data programming and reading. Functionally, the system controller 618 may include a front end 622 that interfaces with the host system, controller logic 624 for coordinating operation of the memory 616, flash management logic 626 for internal memory management operations such as garbage collection, and one or more flash interface modules (FIMs) 628 to provide a communication interface between the controller with the flash memory 616.

FIG. 7 illustrates a controller integrated circuit chip that is the system controller 618. In particular, the system controller 618 may be implemented on a single integrated circuit chip, such as an application specific integrated circuit (ASIC) such as shown in FIG. 7. The processor 706 of the system controller 618 may be configured as a multi-thread processor capable of communicating via a memory interface 704 having I/O ports for each memory bank in the flash memory 616. The system controller 618 may include an internal clock 718. Alternatively, the host may transmit a clock signal through a host interface 716 to the system controller 618. The host interface 716 may transmit and/or receive data signals to/from the host. The processor 706 communicates with an error correction code (ECC) module 714, a RAM buffer 712, the host interface 716, and ROM 710 via an internal data bus 702. The ROM 710 may be used to initialize a memory system 602, such as a flash memory device. The memory system 602 that is initialized may be referred to as a card. The ROM 710 may be a region of read only memory whose purpose is to provide boot code to the RAM for processing a program, such as the initialization and booting of the memory system 602. The ROM may be present in the ASIC rather than the flash memory chip.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A flip-flop comprising:
   a plurality of mixed threshold voltage transistors, wherein the plurality of transistors includes standard threshold voltage devices and high threshold voltage devices;
   a data input, a clock input, and a reset input into the flip-flop; and
   two output signals from the flip-flop;
   wherein at least a subset of the transistors at the data input comprises standard threshold voltage devices and at least a subset of the transistors at the output signals and the clock input comprises high threshold voltage devices;
   further wherein the flip-flop is configured to have the mixed threshold voltage transistors switched based on an effective speed per leakage current for the flip-flop that is calculated as the mixed threshold voltage transistors are iteratively switched between being high threshold voltage devices and standard threshold voltage devices to determine which mixed threshold voltage transistors are standard threshold voltage devices and to determine which mixed threshold voltage transistors are high threshold voltage devices.

2. The flip-flop of claim 1 wherein the standard threshold voltage devices are located in at least one critical path that determines circuit delay and the high threshold voltage devices are located in non-critical paths to reduce leakage current.

3. The flip-flop of claim 1 wherein the mixed threshold voltage transistors further includes low threshold voltage devices.

4. The flip-flop of claim 3 wherein the low threshold voltage devices are located in at least one of the timing critical paths.

5. The flip-flop of claim 1 wherein the timing critical paths include standard and low threshold voltage devices along the paths.

6. The flip-flop of claim 5 wherein the timing critical path comprise devices that must complete an operation in a short duration, further wherein the operation is required by events occurring at either an input stage of the flip-flop or an output stage of the flip-flop.

* * * * *